United States Patent
Hsu et al.

(10) Patent No.: US 7,596,649 B2
(45) Date of Patent: Sep. 29, 2009

(54) MOTHERBOARD

(75) Inventors: Shou-Kuo Hsu, Tu-Cheng, Taipei Hsien (TW); Cheng-Shien Li, Tu-Cheng, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 158 days.

(21) Appl. No.: 11/759,238

(22) Filed: Jun. 7, 2007

(65) Prior Publication Data

US 2008/0059685 A1 Mar. 6, 2008

(30) Foreign Application Priority Data

Sep. 1, 2006 (CN) .................... 2006 1 0062436

(51) Int. Cl.
*G06F 13/00* (2006.01)

(52) U.S. Cl. .................... 710/300; 710/301; 710/316

(58) Field of Classification Search ................ 710/300, 710/301, 105, 305, 306, 307, 316
See application file for complete search history.

(56) References Cited

U.S. PATENT DOCUMENTS

| | | | | |
|---|---|---|---|---|
| 5,788,855 | A * | 8/1998 | Landolf | 216/13 |
| 6,667,677 | B2 * | 12/2003 | Yajima et al. | 335/220 |
| 6,731,184 | B1 * | 5/2004 | Muto et al. | 333/103 |
| 7,145,413 | B2 * | 12/2006 | Hsu et al. | 333/33 |
| 7,158,899 | B2 * | 1/2007 | Sunter et al. | 702/69 |
| 7,174,411 | B1 * | 2/2007 | Ngai | 710/316 |
| 7,246,190 | B2 * | 7/2007 | Nguyen et al. | 710/306 |
| 7,248,470 | B2 * | 7/2007 | Chen et al. | 361/686 |
| 7,362,589 | B2 * | 4/2008 | Gay | 361/785 |
| 7,388,937 | B1 * | 6/2008 | Rodger et al. | 375/348 |
| 7,444,452 | B2 * | 10/2008 | Chen et al. | 710/307 |
| 2005/0102454 | A1 * | 5/2005 | McAfee et al. | 710/107 |
| 2005/0240703 | A1 * | 10/2005 | Nguyen et al. | 710/301 |
| 2005/0268124 | A1 * | 12/2005 | Pham et al. | 713/300 |
| 2006/0085585 | A1 * | 4/2006 | Wu et al. | 710/306 |
| 2006/0098016 | A1 * | 5/2006 | Chou et al. | 345/501 |

(Continued)

FOREIGN PATENT DOCUMENTS

JP      03-255516 A      11/1991

OTHER PUBLICATIONS

Skew Definition and Jitter Analysis, Texas Instrument Incorporated, Feb. 2002.*

*Primary Examiner*—Khanh Dang
(74) *Attorney, Agent, or Firm*—Frank R. Niranjan

(57) ABSTRACT

A motherboard includes a chipset, a first connector pad suitable for receiving a first type of PCI connector, a second connector pad suitable for receiving a second type of PCI connector, a plurality of first transmission lines, a plurality of second transmission lines, and a plurality of areas for mounting switches. One end of each first transmission line is connected to the chipset, another end of each first transmission line is connected to an end of a corresponding area, one end of each second transmission line is connected to another end of the corresponding area, another end of each second transmission line is connected to the second connector pad, the first connector pad is connected to the plurality of first transmission lines, and the switches are selectively mounted on the plurality of areas.

7 Claims, 2 Drawing Sheets

U.S. PATENT DOCUMENTS

2006/0098020 A1* 5/2006 Shen et al. .................. 345/520
2006/0198175 A1* 9/2006 Badawi et al. ................. 365/51
2007/0038794 A1* 2/2007 Purcell et al. ............... 710/306
2007/0150762 A1* 6/2007 Sharma et al. ............. 713/300

* cited by examiner

MOTHERBOARD

BACKGROUND OF THE INVENTION

1. Field of the Invention

The present invention relates to a motherboard, and particularly to a motherboard that flexibly supports different peripheral component interface (PCI) connectors.

2. Description of Related Art

A typical personal computer comprises a motherboard, memory modules, and peripheral accessories, and the motherboard is the heart of the personal computer. On the motherboard, in addition to the central processing unit (CPU), the chip set, and the slots for installing the memory modules, it further includes PCI connectors to install interface cards. According to different requirements of users, the amount of PCI connectors is variable. For example, a PCI express chipset can support one PCI-Express×8 connector, or two PCI-Express×4 connectors. It is a disadvantage that the PCI express chipset can support only one or the other of the PCI-Express connectors at one time because layout of the motherboard must be changed accordingly, thus the cost for producing motherboards is high.

What is needed is to provide a layout of the motherboard capable of flexibly supporting different interface card connectors.

SUMMARY OF THE INVENTION

A motherboard includes a chipset, a first connector pad suitable for receiving a first type of PCI connector, a second connector pad suitable for receiving a second type of PCI connector, a plurality of first transmission lines, a plurality of second transmission lines, and a plurality of areas for mounting switches. One end of each first transmission line is connected to the chipset, another end of each first transmission line is connected to an end of a corresponding area, one end of each second transmission line is connected to another end of the corresponding area, another end of each second transmission line is connected to the second connector pad, the first connector pad is connected to the plurality of first transmission lines, and the switches are selectively mounted on the plurality of areas.

Other advantages and novel features of the present invention will become more apparent from the following detailed description of preferred embodiment when taken in conjunction with the accompanying drawings, in which:

DETAILED DESCRIPTION OF THE INVENTION

Figure 1:
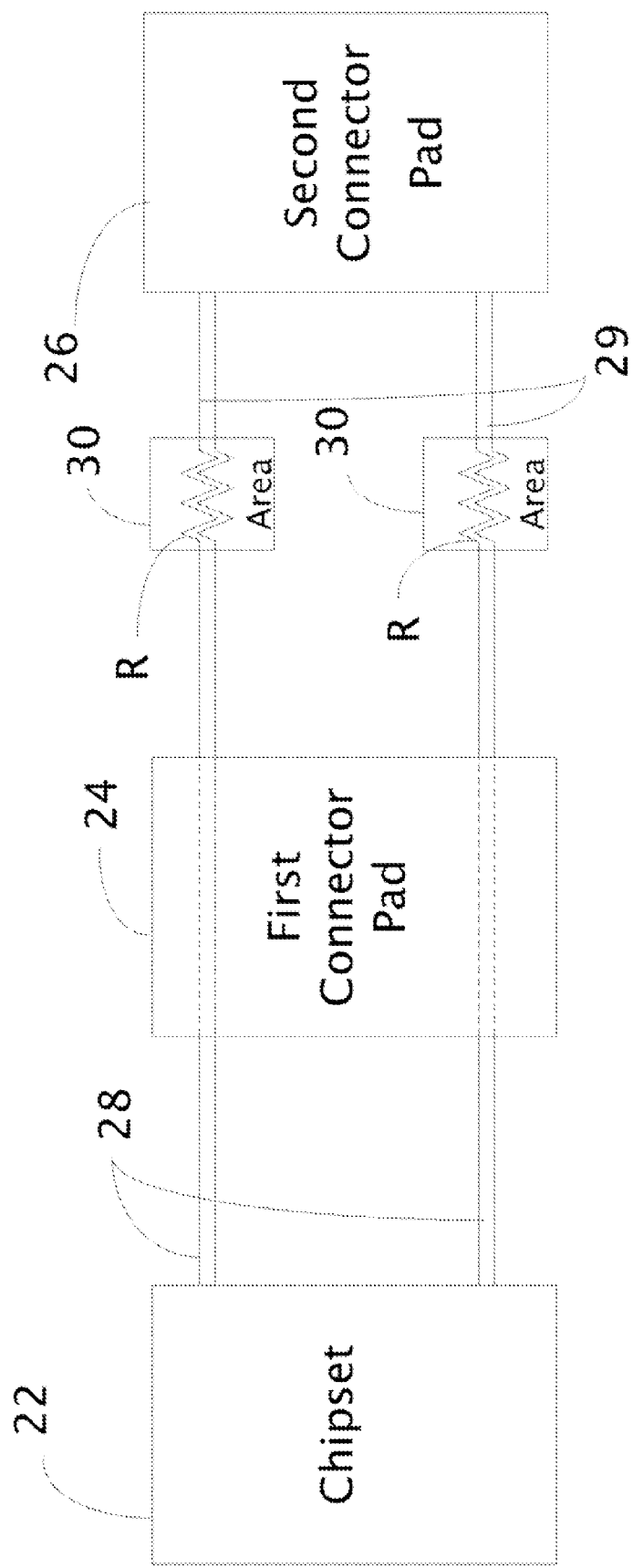
FIG. 1 is a circuit diagram of a motherboard in accordance with a preferred embodiment of the present invention.

Referring to FIG. 1, a motherboard in accordance with a preferred embodiment of the present invention includes a chipset 22, a first connector pad 24, a second connector pad 26, a plurality of first transmission lines 28, a plurality of second transmission lines 29, and a plurality of areas 30 for mounting switches. One end of each first transmission line 28 is connected to the chipset 22, another end of each first transmission line 28 is connected to an end of a corresponding area 30, one end of each second transmission line 29 is connected to another end of the corresponding area 30, and another end of each second transmission line 29 is connected to the second connector pad 26. The first connector pad 24 is connected to the plurality of first transmission lines 28 between the areas 30 and the chipset 22, and is suitable for receiving a first type of PCI connector, and the second connector pad 26 is suitable for receiving a second type of PCI connector. The switch in this preferred embodiment is a resistor R, mounted on the area 30 when the second connector pad is used.

When the first type of PCI connector is mounted on the first connector pad 24, the resistors R are removed from the areas 30 thereby disconnecting the second transmission lines 29 from the first transmission lines 28. The removal of the switches makes a segment of each of the first transmission lines 28 that connect the first connector pad 24 to the area 30 a stub. In order to avoid signal reflection because of impedance mismatching, the length of the segment of the first transmission line 28 must satisfy the following formula:

$$L_{stub} < (T_j * V)/2$$

Wherein $L_{stub}$ denotes the length of the transmission line segment, $T_j$ denotes a jitter tolerance of a signal in the transmission line, V denotes the speed of the signal.

When the second type of PCI connector is mounted on the second connector pad 26, the first connector pad 24 is idle, the resistors R are mounted on the areas 30 to connect the second transmission lines 29 to the first transmission lines 28, thus the chipset 22 can communicate with the second connector mounted on the second connector pad 26.

The resistance of the resistor R is preferably zero Ohms. Alternatively, the zero Ohm resistor can be replaced by a jumper (shown in FIG. 2). The function of the resistor in this embodiment is as a switch, when the second connector is mounted on the motherboard the switch is turned on by placement of the resistor, when the first connector is mounted on the motherboard the switch is turned off by removal of the resistor.

Figure 2:
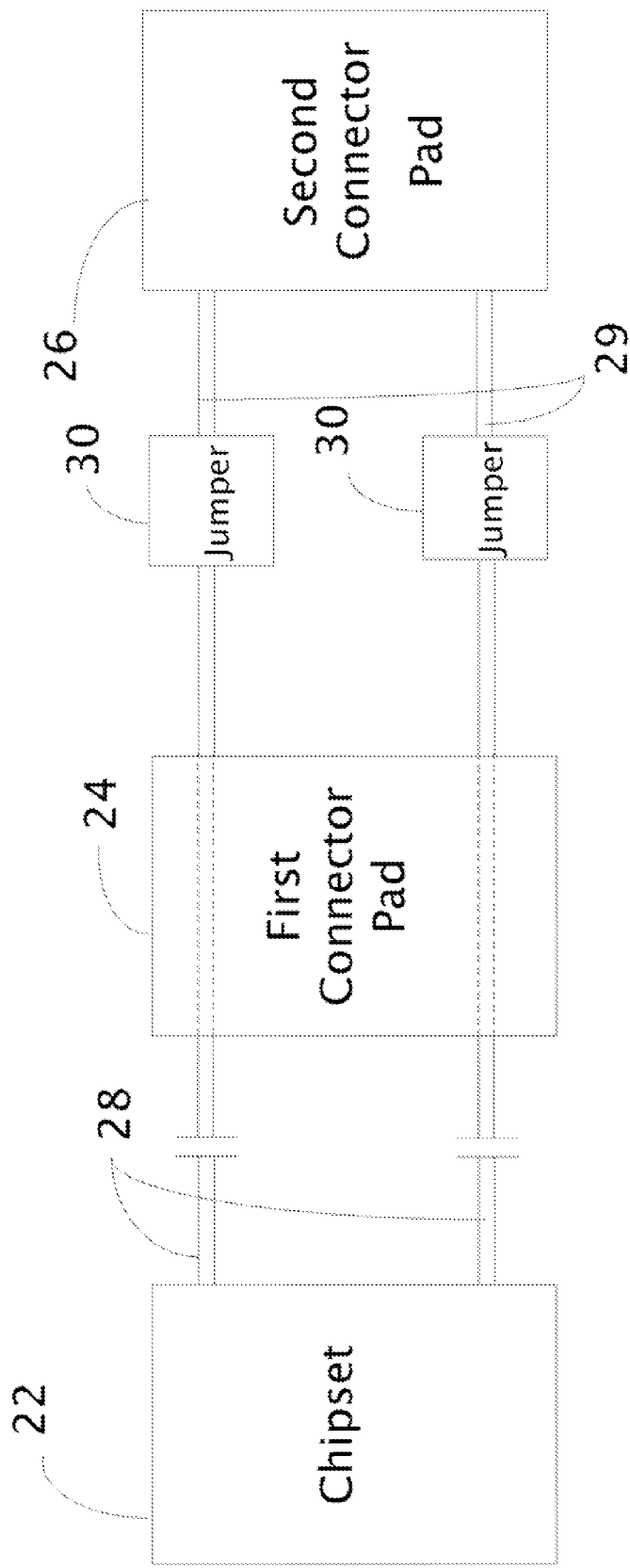
FIG. 2 is a circuit diagram of a motherboard in accordance with another preferred embodiment of the present invention.

Referring to FIG. 2, a capacitor can be connected in the first transmission line 28 to filter signal noise.

The chipset 22 can be a north bridge chipset, the first PCI connector can be a PCI-express×8 connector, and the second PCI connector can be a PCI-express×4 connector.

Thus, the motherboard is capable of flexibly supporting different PCI-express connectors using one layout, and signal integrity is maintained, and the cost for designing and producing motherboards is reduced.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A motherboard, comprising:
   a chipset mounted thereon;
   a first connector pad arranged thereon and configured for receiving a first type of PCI connector;
   a second connector pad arranged thereon and configured for receiving a second type of PCI connector different from the first type of PCI connector;
   a plurality of first transmission lines;
   a plurality of second transmission lines; and
   a plurality of areas for mounting switches, wherein one end of each of the first transmission lines is connected to the chipset, another end of each of the first transmission lines is connected to an end of a corresponding area, one end of each of the second transmission lines is connected to another end of the corresponding area, another end of each of the second transmission lines is connected to the second connector pad, the first connector pad is connected to the plurality of first transmission lines, and the switches are selectively mounted on the plurality of areas, wherein a length of the transmission line between the first connector pad and the area where the switches are mounted satisfies the following formula: $Lstub < (Tj*V)/2$, wherein Lstub denotes the length of the transmission line between the first connector pad and the area, Tj denotes the jitter tolerance of a signal in the transmission line, V denotes the speed of the signal.

2. The motherboard as claimed in claim 1, wherein the first type of PCI connector and the second type of PCI connector is alternatively mounted on the motherboard, when the second type of PCI connector is mounted on the second connector pad, the switches are mounted on the plurality of areas respectively, when the first type of PCI connector is mounted on the first connector pad, the switches are removed from the plurality of areas.

3. The motherboard as claimed in claim 1, wherein the switch is a zero Ohm resistor.

4. The motherboard as claimed in claim 1, wherein the switch is a jumper.

5. The motherboard as claimed in claim 1, wherein a capacitor is connected to each of the first transmission lines for filtering signal noise.

6. A motherboard, comprising:

a chipset mounted thereon;

a first connector pad arranged thereon and configured for receiving a first type of PCI connector, the first connector connected with the chipset via a plurality of first transmission lines;

a second connector pad arranged thereon and configured for receiving a second type of PCI connector different from the first type of PCI connector; and a plurality of second transmission lines each connecting the second connector pad with a corresponding one of the first transmission lines via a switch, wherein the switches are selectively turned off to allow the first connector pad receiving the first type of PCI connector or turned on to allow the second connector pad receiving the second type of PCI connector, wherein a length of each of the transmission lines between the first connector pad and the corresponding switch satisfies the following formula: $Lstub<(Tj*V)/2$, wherein Lstub denotes the length of each of the transmission lines between the first connector pad and the corresponding switch, Tj denotes the jitter tolerance of a signal in the transmission line, V denotes the speed of the signal.

7. The motherboard as claimed in claim 6, wherein the first PCI connector is a PCI-express×8 connector, and the second PCI connector is a PCI-express×4 connector.

* * * * *